United States Patent [19]

Kurtz et al.

[11] Patent Number: 5,035,981
[45] Date of Patent: Jul. 30, 1991

[54] MULTILAYER, SHEET-LIKE, PHOTOSENSITIVE RECORDING MATERIAL

[75] Inventors: Karl-Rudolf Kurtz, Heidelberg; Horst Koch, Gruenstadt; Thomas Telser, Ludwigshafen; Helmut Bach, Mutterstadt, all of Fed. Rep. of Germany

[73] Assignee: BASF Aktiengesellschaft, Ludwigshafen, Fed. Rep. of Germany

[21] Appl. No.: 475,802

[22] Filed: Feb. 6, 1990

Related U.S. Application Data

[62] Division of Ser. No. 264,893, Oct. 31, 1988, Pat. No. 4,946,758.

[30] Foreign Application Priority Data

Oct. 31, 1987 [DE] Fed. Rep. of Germany ....... 3736980

[51] Int. Cl.$^5$ .................. G03F 7/30; G03F 7/09
[52] U.S. Cl. .................. 430/327; 430/325; 430/262; 430/263; 430/259
[58] Field of Search .............. 430/327, 325, 262, 263, 430/259

[56] References Cited

U.S. PATENT DOCUMENTS

| | | | |
|---|---|---|---|
| 3,458,311 | 7/1969 | Alles | 96/35.1 |
| 3,884,693 | 5/1975 | Bauer et al. | 96/15 |
| 3,990,897 | 11/1976 | Zuerger et al. | 96/67 |
| 4,072,527 | 2/1978 | Fan | 96/87 R |
| 4,292,392 | 9/1981 | Ikeda et al. | 430/271 |
| 4,740,450 | 4/1988 | Tamaoki et al. | 430/273 |

FOREIGN PATENT DOCUMENTS

| | | |
|---|---|---|
| 2823300 | 12/1979 | Fed. Rep. of Germany. |
| 1001833 | 8/1965 | United Kingdom. |
| 1320565 | 6/1973 | United Kingdom. |

Primary Examiner—Cynthia Hamilton
Attorney, Agent, or Firm—Keil & Weinkauf

[57] ABSTRACT

In a process for preparing a photopolymer printing plate, relief plate or photoresist from a photosensitive recording element containing A) a photopolymerizable relief-forming layer which can be developed with liquid developer after imagewise exposure to actinic light, B) a top layer which consists of polymers forming films of high tensile strength, adheres firmly to the photopolymerizable relief-forming layer (A) and is soluble or swellable in the liquid developers and C) a cover sheet which can readily be peeled off from the top layer (B), comprising peeling off the cover sheet (C) from the top layer (B), imagewise exposing to actinic light and developing the relief-forming layer (A), the formation of an electrostatic charge on top of the photosensitive recording element being prevented by incorporating into the element a top layer (B) containing specific tertiary amines and/or amides and/or specific quaternary ammonium salts.

8 Claims, No Drawings

MULTILAYER, SHEET-LIKE, PHOTOSENSITIVE RECORDING MATERIAL

This is a division of application Ser. No. 264,893, filed Oct. 31, 1988, now U.S. Pat. No. 4,946,759.

The present invention relates to a multilayer, sheet-like, photosensitive recording material which is printing plates, gravure printing plates, flexographic printing plates and relief plates and photoresists and which contains the following layers one on top of the other in the following order:

A) a photosensitive relief-forming layer in which imagewise exposure to actinic light results in a difference in solubilities between the exposed and unexposed parts, so that the layer can be developed with organic, aqueous alcoholic or aqueous alkaline liquid media, the layer consisting of the following components, based on its total amount:
 $a_1$) from 20 to 98.999% by weight of one or more polymeric binders,
 $a_2$) from 0.001 to 10% by weight of one or more photopolymerization initiators,
 $a_3$) from 1 to 60% by weight of one or more components which are compatible with the binder ($a_1$) and contain photopolymerizable olefinically unsaturated groups and
 $a_4$) from 0 to 40% by weight of one or more assistants for varying the performance characteristics;

B) a smooth or matt, non-tacky top layer which is transparent to light and soluble or swellable in the relevant liquid media, adheres more firmly to the layer (A) than to the cover sheet (C) and is formed by a polymer forming films of high tensile strength and the additives present therein; and C) a cover sheet which can be readily detached from the top layer (B).

The term sheet-like includes all spatial forms whose thickness is substantially smaller than their length and width, so that the recording material in question is a belt-like or plate-like one.

Liquid media are understood as being solvents or solvent mixtures, which may contain additives, such as solid, liquid or gaseous, organic and inorganic compounds. These media are used for development, ie. washing out the relief-forming layer (A) which has been exposed imagewise, and are therefore generally referred to as developers for short. The solubility or swellability of the binder ($a_1$) in the relevant developer is a particular precondition which has to be met in order to be able to wash out a certain relief-forming layer (A) which has been exposed imagewise with a certain developer. The nature of the developer therefore also permits clear conclusions about the composition of the relief-forming layer (A).

The term compatible indicates that the relevant component can be distributed in the relief-forming layer (A) in molecular disperse form, does not produce any turbidity in the said layer and furthermore does not separate out in the course of time.

Here, components ($a_3$) containing photopolymerizable olefinically unsaturated groups may very generally be separate compounds, or groups which are bonded as side radicals or terminal radicals to the polymeric binders ($a_1$). Separate compounds are usually referred to as monomers, and groups bonded to binders are referred to below as photopolymerizable radicals.

Variation of the property profile is to be understood as meaning the selective improvement of certain performance characteristics of photosensitive relief-forming layers (A) and of photopolymerized relief layers (A') prepared therefrom. These improvements manifest themselves, in particular, in letterpress printing plates, gravure printing plates, flexographic printing plates and relief plates and photoresists each containing photopolymerized relief layers (A') and are generally achieved by adding conventional and known additives to the relief-forming layers (A). These additives are therefore referred to as assistants The statement that the top layer (B) should adhere more firmly to the relief-forming layer (A) than to the cover sheet (C) and that the cover sheet (C) should be readily detachable from the top layer (B) also contains more precise information about the composition, since the different adhesions of these layers to one another are attributable to their particular compositions, which can be obtained in a known manner.

The cover sheet (C) should be capable of being detached from the top layer (B) without damaging the latter.

Multilayer, sheet-like, photosensitive recording materials of the stated type whose top layer (B) contains not only the polymers forming films of high tensile strength but also additives are known.

Thus, DE-A No. 24 56 439 (U.S. Pat. No. 4 162 919) discloses a recording material whose relief-forming layer (A) contains vinylaromatic/alkadiene block copolymers as binders ($a_1$). The relief-forming layer (A) can be washed out with organic developers after the imagewise exposure. It is firmly bonded to a hard, non-tacky, transparent, 0.5–20 $\mu$m thick polyamide or copolyamide film which is soluble in the developer. This film or this top layer (B) may contain small amounts, ie. $\leq 10\%$ by weight, based on (B), of monomers, photopolymerization initiators and thermal polymerization inhibitors. A removable protective or cover sheet (C), which can be detached from (B) without separating (B) from (A), may be present on top of this top layer (B).

A similar recording material is disclosed in DE-A No. 28 23 300, which mentions the use of polyurethanes for producing the top layer (B).

Another similar recording material whose relief-forming layer (A) contains, as binder ($a_1$), polyalkadienes (natural rubber, polybutadiene), alkadiene/acrylonitrile copolymers (butadiene/acrylontrile), vinylaromatic/alkadiene copolymers (styrene/butadiene), silicone rubbers, polysulfide rubbers, fluorine rubbers (vinylidene chloride/hexafluoropropylene copolymers), vinylaromatic/alkadiene block copolymers (styrene/isoprene, styrene/butadiene) or polyurethanes is disclosed in U.S. Pat. No. 3,990,897.

Furthermore, DE-B No. 21 23 702 discloses a recording material whose relief-forming layer (A) can be developed in aqueous alkaline media and contains polyamides, polyvinyl acetates or polymethyl methacrylates as binders ($a_1$) and whose water-soluble top layer (B) consists of polyvinyl alcohol and an oxyethylated oleyl phosphate.

U.S. Pat. No. 4,072,527 discloses a recording material whose relief-forming layer (A) can be developed in an aqueous alkaline medium after the imagewise exposure and contains, for example, methacrylic acid/methyl methacrylate copolymers as binders ($a_1$). The top layer (B) of this recording material is from 0.2 to 25 $\mu$m thick and contains a water-soluble polymer, such as partially hydrolyzed polyvinyl acetate, chloroacetate or propionate (degree of hydrolysis 88-100%) and, finely dispersed herein, a water-insoluble polymer from the group consisting of the (meth)acrylate homopolymers and copolymers, from the group consisting of the vinylpyrrolidone/vinyl acetate copolymers or from the group consisting of the vinylidene chloride/alkyl acrylate/itaconic acid copolymers. This top layer (B) is prepared by casting from aqueous solution. According to the Patent, in order to ensure that the casting solution can satisfactorily cover the surface of the relief-forming layer (A), an anionic or nonionic wetting agent, referred to there as a surfactant, should be concomitantly used in a small amount. In particular, sodium alkylsulfates and sulfonates of 12 to 18 carbon atoms, such as sodium dodecylsulfate or sodium octadecylsulfonate, or polyethylene glycols having a mean molecular weight of less than 400, for example isooctylphenylpolyethoxyethanol having 9 or 10 ethoxy groups, are considered. The use of the fluorinated wetting agent

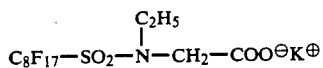

in an amount of 1% by weight, based on the total amount of the solids in the casting solution, is particularly recommended. The recording material of U.S. Pat. No. 4,072,527 is used in particular for the production of offset printing plates.

A recording material which is similar to this and whose top layer (B) contains not only polyvinyl alcohol having a degree of hydrolysis of more than 88% but also a small amount of isooctylphenylpolyetooxyethanol having 9 or 10 ethoxy groups is disclosed in U.S. Pat. No. 3,453,311 (DE-B No. 5 72 153) or in DE-A No. 16 22 298.

The known multilayer, sheet-like, photosensitive recording materials which contain the layers (A), (B) and (C) have disadvantages which hinder or even prevent the use of these recording materials for the production of high quality photopolymerized letterpress printing plates, gravure printing plates, flexographic printing plates and relief printing plates and photoresists which reproduce detail particularly faithfully.

For example, peeling off the cover sheet (C) from the top layer (B) in these recording materials results in a high electrostatic charge on the remaining layers (A) and (B). This high static charge causes deposition of dirt particles on the surface of the top layer (B), with the result that the copying properties of the recording materials are very adversely affected. Because of the deposited dirt particles, the image masks or photographic negatives through which exposure is carried out no longer lie exactly on the recording materials, which leads to poor resolution during exposure, to problems with the reproduction of shadows and to side lighting by scattered light, generally resulting in an ill-defined image which does not meet very high quality requirements. This is particularly serious in the production of photopolymerized letterpress, gravure and flexographic printing plates, in which the dirt deposit finally leads, during printing, to an unfavorable change in ink acceptance and inking, to fragmentation of the edges and to poorer relief adhesion, which substantially reduces the life of these printing plates in continuous printing. However, large dirt particles furthermore cause pits in the photopolymerized relief layers (A'), which is very particularly troublesome in gravure printing plates, because even shallow pits of this type produce a printed image.

To date, it has only been possible to control this deposition of dirt particles due to the electrostatic charge by working in substantially dust-free air; however, this is not generally possible in industry because the necessary extensive preconditions in terms of structure and apparatus are often lacking. For this reason, a frequently used remedy is to clean the surface of the top layer (B) prior to exposure, which is, however, disadvantageous both in terms of work and from an economic point of view.

It is an object of the present invention to provide a novel multilayer, sheet-like, photosensitive recording material which no longer has the disadvantages of the known recording materials and thus permits the production of high quality photopolymerized letterpress printing plates, gravure printing plates, flexographic printing plates and relief plates and photoresists which faithfully reproduce detail.

We have found that this object is achieved by a multilayer, sheet-like, photosensitive recording material which is used for the production of photopolymerized letterpress printing plates, gravure printing plates, flexographic printing plates and relief plates and photoresists and contains the following layers one on top of the other in the following order:

A) a photosensitive relief-forming layer in which imagewise exposure to actinic light results in a difference in the solubilities between the exposed and unexposed parts, so that the layer can be developed with organic, aqueous alcoholic or aqueous alkaline liquid media, the layer consisting of the following components, based on its total amount
  $a_1$) from 20 to 98.999% by weight of one or more polymeric binders,
  $a_2$) from 0.001 to 10% by weight of one or more photopolymerization initiators,
  $a_3$) from 1 to 60% by weight of one or more components which are compatible with the binder ($a_1$) and contain photopolymerizable olefinically unsaturated groups and
  $a_4$) from 0 to 40% by weight of one or more assistants for varying the performance characteristics;

B) a smooth or matt, non-tacky top layer which is transparent to light and is soluble or swellable in the relevant liquid media, adheres more firmly to the layer (A) than to the cover sheet (C) and is formed from a polymer forming films of high tensile strength and the additives present therein; and C) a cover sheet which can be readily detached from the top layer (B),
  wherein the top layer (B) contains, based on its total amount, from 1 to 20% by weight of one or more compounds from the group consisting of the
  $b_1$) tertiary amines and amides of the general formula I

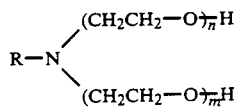

where R is $C_{12}$–$C_{18}$-alkyl, $C_{18}$-alkenyl, $C_{12}$–$C_{18}$-alkanecarbonyl or $C_{18}$-alkenecarbonyl, n is an integer from 1 to 15 and, independently of this, m is an integer from 1 to 15,
and/or from the group consisting of the
b₂) quaternary ammonium salts of the general formula II $$[NR^1R^2R^3R^4]^\oplus \ X^\ominus \qquad II$$

where $X^\ominus$ is $Cl^\ominus$, $Br^\ominus$, $I^\ominus$, $R^1\text{-O})_2PO_2^\ominus$, $R^1\text{-}PO_3^\ominus$, $R^1\text{-}SO_3^\ominus$, $R^1\text{-}COO^\ominus$, $CF_3SO_3^\ominus$ or $R^1\text{-}OSO_3^\ominus$, $R^1$ is $C_1$–$C_4$-alkyl $R^2$ and $R^3$ are each $C_1$–$C_{20}$-alkyl or -(-$CH_2CH_2$-O-)$_n$-H, where n is an integer from 1 to 15, and $R^2$ and $R^3$ may be identical or different, and $R^4$ is -(-$CH_2CH_2$-O-)$_n$-H, where n is an integer from 1 to 15, $C_{12}$-, $C_{14}$-, $C_{16}$- and $C_{18}$-alkyl, 3-azatridecan-1-yl to 3-azadocosan-1-yl, 4-azatridecan-1-yl to 4-azadocosan-1-yl, 3-aza-4-oxotridecan-1-yl to 3-aza-4-oxodocosan-1-yl, 4-aza-5-oxotridecan-1-yl to 4-aza-5-oxodocosan-1-yl, 3-oxatridecan-1-yl to 3-oxadocosan-1-yl, 4-oxotridecan-1-yl to 4-oxadocosan-1-yl or 2-hydroxy-4-oxatridecan-1-yl to 2-hydroxy-4-oxadocosan-1-yl.

An important component of the novel, multilayer, sheet-like, photosensitive recording material (referred to below as novel recording material for short) is the novel top layer (B).

The novel top layer (B) is usually from 0.2 to 25 μm thick and covers, completely and in uniform thickness, the photosensitive relief-forming layer (A) underneath it. The said top layer is transparent to light and thus does not interfere with the imagewise exposure of the relief-forming layer (A) to actinic light. It is soluble or at least swellable in the developers with which the imagewise exposed relief-forming layer (A) is washed out, so that it can be completely removed from the photopolymerized relief layer (A') during development. In general, it is impermeable to oxygen, so that it prevents inhibition of the photopolymerization by atmospheric oxygen in the relief-forming layer (A). It is non-tacky, allowing an image mask or photographic negative placed on top of it to be readily detached again from the recording material, and adheres more firmly to the relief-forming layer (A) than to the cover sheet (C) on top of it.

The novel top layer (B) may be smooth, ie. it may have a surface roughness $R_{max}$ of ≤0.1 m. Advantageously, it is matt, ie. its surface roughness $R_{max}$ is from 0.1 to 15 μm, preferably from 0.3 to 10 μm, in particular from 0.5 to 7 μm. Because of the matt surface, the time in which the image mask or photographic negative can be brought into contact with the recording material is substantially reduced.

If the thickness of the novel top layer (B) is smaller than its surface roughness $R_{max}$, the surface of the relief-forming layer (A) which lies below the top layer (B) is likewise matt, which is often advantageous.

The novel top layer (B) contains, based on its total amount, from 80 to 99, in particular from 85 to 98, by weight of a polymer forming films of high tensile strength. Examples of such polymers are polymers from the group consisting of the polyamides, copolyamides, polyurethanes, poly(meth)acrylates, polyvinyl alcohol alkanecarboxylates having a degree of hydrolysis of from 30 to 99%, the cyclized rubbers having a high degree of cyclization, the ethylene/propylene copolymers, the homopolymers and copolymers of vinyl chloride and the ethylene/vinyl acetate copolymers. Polymers of this type are generally known. The choice of the polymer for the production of the top layer (B) depends primarily on the solubility properties of the polymer on the one hand and on the relief-forming layer (A) to be covered with the said top layer on the other hand: the solubilities, which are generally known, should be matched with one another so that both layers (A) and (B) can be washed out or washed away with one and the same developer.

If the novel top layer (B) contains less than 80% by weight of the polymer, it is difficult to obtain a constant thickness over the entire relief-forming layer (A); furthermore, it may not then perform its full protective function or display its full antiadhesion effect.

If the novel top layer (B) contains more than 99% by weight of the polymer, its dirt-repelling action is noticeably smaller.

With regard to the dirt-repelling action on the one hand and the other performance characteristics on the other, a content of from 85 to 98% by weight of the polymer in the top layer (B) constitutes an optimum.

According to the invention, the novel top layer (B) contains from 1 to 20, in particular from 2 to 15, % by weight, based on its total weight, of one or more compounds from the group consisting of the tertiary amines and amides (b₁) of the general formula I and/or from the group consisting of the quaternary ammonium salts (b₂) of the general formula II.

If the novel top layer (B) contains less than 1% by weight of the compounds (b₁) and (b₂) to be used according to the invention, its dirt-repelling action is noticeably smaller.

If, on the other hand, the novel top layer (B) contains more than 20% by weight of the compounds (b₁) and (b₂) to be used according to the invention, its dirt-repelling action is good, so that dirt particles are not deposited on the said layer, but it has no further advantages in its other performance characteristics.

With regard to the dirt-repelling action on the one hand and the other performance characteristics on the other, a content of from 2 to 15% by weight of the compounds (b₁) and/or (b₂) to be used according to the invention in the top layer (B) constitutes an optimum.

Examples of radicals R to be used according to the invention, in tertiary amines and amides (b₁) of the general formula I, are dodecyl (=lauryl), tridecyl, tetradecyl (=myristyl), pentadecyl, hexadecyl (=palmityl), heptadecyl, octadecyl (=stearyl), oleyl, 1-oxododecan-1-yl, 1-oxotridecan-1-yl, 1-oxotridecan-1-yl, 1-oxotridecan-1-yl, 1-oxopentadecan-1-yl, 1-oxohexadecan-1-yl, 1-oxoheptadecan-1-yl, 1-oxooctadecan-1-yl and 1-oxooctadec-9-en-1-yl.

The amines and amides (b₁) to be used according to the invention are formed in general by oxyethylation of amines, such as dodecylamine (=laurylamine), tridecylamine, tetradecylamine (=myristylamine), pentadecylamine, hexadecylamine (=palmitylamine), heptadecylamine (=stearylamine) or oleylamine or mixtures of these or by oxyethylation of amides, such as lauramide, tridecanecarboxylic acid amide, myristic acid amide, pentadecanecarboxylic acid amide, palmitic acid amide, heptadecanecarboxylic acid amide, stearamide or oleamide. Two 2-hydroxyethyl groups are bonded to each nitrogen atom, corresponding to the condition where n and m are each 1 in the general formula I. However, one or two longer-chain ω-hydroxypoly-(ethylene oxide)-α-yl radicals are also bonded to a nitrogen atom, these radicals independently of one another each having up to 15, preferably from 5 to 12, in particular from 8 to 11, ethylene oxide units. If only one long-chain radical is bonded to the nitrogen atom, the other radical is a 2-hydroxyethyl group. Bonding of two 2-hydroxyethyl groups to a nitrogen atom is preferred.

Examples of particularly advantageous tertiary amines and amides (b1) are accordingly N,N-bis-(2-hydroxyethyl)-N-dodecyl(=lauryl)-, -N-tridecyl-, -N-tetradecyl(=myristyl)-, -N-pentadecyl-, -N-hexadecyl(-=palmityl)-, -N-heptadecyl-, -N-stearyl- and -N-oleylamine and mixtures of these; and N,N-bis-(2-hydroxyethyl)-lauramide, -tridecanecarboxylic acid amide, -myristic acid amide, -pentadecanecarboxylic acid amide, -palmitic acid amide, -heptadecanecarboxylic acid amide, -stearamide and -oleamide and mixtures of these; and all mixtures which contain these amines and amides together.

Examples of radicals $R^1$ to be used according to the invention in quaternary ammonium salts (b2) of the general formula II are methyl, ethyl, n-propyl, isopropyl, n-butyl and isobutyl.

Examples of suitable anions $X^\ominus$ in quaternary ammonium salts (b2) of the general formula II are chloride, bromide, iodide, $R^1\text{-O-PO}_3H^\ominus$, $(R^1\text{-O})_2PO_2^\ominus$, $R^1\text{-PO}_3^\ominus$, $R^1SO_3^\ominus$, $R^1\text{-COO}^\ominus$, $CF_3SO_3^\ominus$ or $R^1\text{-OSO}_3^\ominus$, where $R^1$ has the above meanings.

Examples of radicals $R^2$ and $R^3$ to be used according to the invention in quaternary ammonium salts (b2) of the general formula II are methyl, ethyl, n-propyl, isopropyl, n-butyl, isobutyl, n-pentyl, n-hexyl, n-heptyl, n-octyl, isooctyl, n-nonyl, n-decyl, n-undecyl, n-dodecyl (=lauryl), n-tridecyl, n-tetradecyl (=myristyl), n-pentadecyl, n-hexadecyl (=palmityl), n-heptadecyl, stearyl, n-nonadecyl and n-eicosanyl, and 2-hydroxyethyl and ω-hydroxypoly-(ethylene oxide)-α-yl having 2 to 15, preferably from 5 to 12, in particular from 8 to 11, ethylene oxide units in the chain. $R^2$ and $R^3$ are identical or different.

Examples of radicals $R^4$ to be used according to the invention in quaternary ammonium salts (b2) of the general formula II are 2-hydroxyethyl and ω-hydroxypoly-(ethylene oxide)-α-yl having 2 to 15, preferably 5 to 12, in particular 8 to 11, ethylene oxide units in the chain, lauryl, myristyl, palmityl and stearyl radicals and 3-azatridecan-1-yl, 3-azatetradecan-1-yl, 3-aza-pentadecan-1-yl (=2-laurylaminoethyl), 3-azahexadecan-1-yl, 3-azaheptadecan-1-yl (=2-myristylaminoethyl), 3-azaoctadecan-1-yl, 3-azanonadecan-1-yl (=2-palmiylaminoethyl), 3-azaeicosan-1-yl, 3-azaheneicosan-1-yl (=2-stearylaminoethyl) and 3-azadocosan-1-yl; and 4-azatridecan-1-yl, 4-azatetradecan-1-yl, 4-azapentadecan-1-yl, 4-azahexadecan-1-yl (=3-laurylaminopropyl), 4-azaheptadecan-1-yl, 4-azaoctadecan-1-yl (=3-myristylaminopropyl), 4-azanonadecan-1-yl, 4-azaeicosan-1-yl (=3-palmitylaminopropyl), 4-azaheneicosan-1-yl and 4-azadocosan-1-yl and 3-stearylaminopropyl; and 3-aza-4-oxotridecan-1-yl, 3-aza-4-oxotetradecan-1-yl, 3-aza-4-oxopentadecan-1-yl (=2-laurylamidoethyl), 3-aza-4-oxohexadecan-1-yl, 3-aza-4-oxoheptadecan-1-yl (=2-myristylamidoethyl), 3-aza-4-oxooctadecan-1-yl, 3-aza-4-oxononadecan-1-yl (=2-palmitylamidoethyl), 3-aza-4-oxoeicosan-1-yl, 3-aza-4-oxoheneicosan-1-yl (=2-stearylamidoethyl) and 3-aza-4-oxodocosan-1-yl; and 4-aza-5-oxotridecan-1-yl, 4-aza-5-oxotetradecan-1-yl, 4-aza-5-oxopentadecan-1-yl, 4-aza-5-oxohexadecan-1-yl (=3-laurylamidopropyl), 4-aza-5-oxoheptadecan-1-yl, 4-aza-5-oxooctadecan-1-yl (=3-myristylamidopropyl), 4-aza-5-oxononadecan-1-yl, 4-aza-5-oxoeicosan-1-yl (=3-palmitylamidopropyl), 4-aza-5-oxoheneicosan-1-yl and 4-aza-5-oxodocosan-1-yl and 3-stearylamidopropyl; and 3-oxatridecan-1-yl, 3-oxatetradecan-1-yl, 3-oxapentadecan-1-yl (=2-lauryloxyethyl), 3-oxahexaecan-1-yl, 3-oxaheptadecan-1-yl (=2-yethyl), 3-oxaoctadecan-1-yl, 3-oxanonadecan-1-yl (=2-palmityloxyethyl, 3-oxaeicosan-1-yl, 3-oxaheneicosan-1-yl (=2-stearyloxyethyl) and 3-oxadocosan-1-yl; and 4-oxatridecan-1-yl, 4-oxatetradecan-1-yl, 4-oxapentadecan-1-yl, 4-oxahexadecan-1-yl (=3-lauryloxypropyl), 4-oxaheptadecan-1-yl, 4-oxaoctadecan-1-yl (=3-myristyloxypropyl), 4-oxanonadecan-1-yl, 4-oxaeicosan-1-yl (=3-palmityloxypropyl), 4-oxaheneicosan-1-yl and 4-oxadocosan-1-yl and 3-stearyloxypropyl; and 2-hydroxy-4-oxatridecan-1-yl, 2-hydroxy-4-oxatetradecan-1-yl, 2-hydroxy-4-oxapentadecan-1-yl, 2-hydroxy-4-oxahexadecan-1-yl (=3-lauryloxy-2-hydroxypropyl), 2-hydroxy-4-oxaheptadecan-1-yl, 2-hydroxy-4-oxaoctadecan-1-yl (=3-myristyloxy-2-hydroxypropyl), 2-hydroxy-4-oxanonadecan-1-yl, 2-hydroxy-4-oxaeicosan-1-yl (=3-palmityloxy-2-hydroxypropyl), 2-hydroxy-4-oxaheneicosan-1-yl and 2-hydroxy-4-oxadocosan-1-yl and 3-stearyloxy-2-hydroxypropyl.

Examples of radicals $R^1$ which are particularly advantageously used in quaternary ammonium salts (b2) of the general formula II are methyl and ethyl.

Examples of radicals $R^2$ and $R^3$ which are particularly advantageously used in the quaternary ammonium salts (b2) of the general formula II are methyl, ethyl, lauryl, myristyl, palmityl, stearyl and 2-hydroxyethyl.

Examples of radicals $R^4$ which are particularly advantageously used in the quaternary ammonium salts (b2) are 2-hydroxyethyl, lauryl, myristyl, palmityl, stearyl, 2-laurylaminoethyl, 2-myristylaminoethyl, 2-palmitylaminoethyl, 2-stearylaminoethyl, 3-laurylaminopropyl, 3-myristylaminopropyl, 3-stearylaminopropyl, 2-laurylamidoethyl, 2-myristylamidoethyl, 2-palmitylamidoethyl, 2-stearylamidoethyl, 3-laurylamidopropyl, 3-myristylamidopropyl, 3-palmitylamidopropyl, 3-stearylamidopropyl, 2-lauryloxyethyl, 2-myristyloxyethyl, 2-palmityloxyethyl, 2-stearyloxyethyl, 3-lauryloxypropyl, 3-myristyloxypropyl, 3-stearyloxypropyl, 3-lauryloxy-2-hydroxypropyl, 3-myristyloxy-2-hydroxypropyl, 3-palmityloxy-2-hydroxypropyl and 3-stearyloxy-2-hydroxypropyl.

The anion which is particularly advantageous to use in the quaternary ammonium salts (B2) of the general formula II is ethylsulfate.

Examples of particularly advantageous quaternary ammonium salts (b2) to be used according to the invention, of the general formula II, are:

N-methyl-N,N-bis-(2-hydroxyethyl)-N-lauryl-, -N-myristyl-, -N-palmityl- or -N-stearylammonium ethylsulfate or N-methyl-N,N-bis-(2-hydroxyethyl)-N-(2-laurylaminoethyl)-, -N-(2-myristylaminoethyl)-, -N-(2-palmitylaminoethyl)-or -N-(2-stearylaminoethyl)-ammonium ethylsulfate or N,N-dimethyl-N-(2-hydroxyethyl)-N-(3-laurylaminopropyl)-, -N-(3-myristylaminopropyl)-, -N-(3-palmitylaminopropyl) or -N-(3-stearylaminopropyl)-ammonium ethylsulfate or N,N,N-trimethyl-N-(2-hydroxyethyl)-ammonium ethylsulfate
or
N,N-dimethyl-N-(2-hydroxyethyl)-N-(2-laurylamidoethyl)-, -N-(2-myristylamidoethyl)-, -N-(2-palmitylamidoethyl)- or -N-(2-stearylamidoethyl)-ammonium ethylsulfate
or
N,N-dimethyl-N-(2-hydroxyethyl)-N-(3-laurylamidopropyl)-, -N-(3-myristylamidopropyl)-, -N-(3-palmitylamidopropyl) or -N-(3-stearylamidopropyl)-ammonium ethylsulfate
or
N-methyl-N,N-bis-(2-hydroxyethyl)-N-(2-lauryloxyethyl)-, -N-(2-myristyloxyethyl)-, -N-(2-palmityloxyethyl)- or -N-(2-stearyloxyethyl)-ammonium ethylsulfate
or
N,N-dimethyl-N-(2-hydroxyethyl)-N-(3-lauryloxypropyl)-, -N-(3-myristyloxypropyl)-, -N-(3-palmityloxypropyl)- or -N-(3-stearyloxypropyl)-ammonium ethylsulfate
or
N-methyl-N,N-bis-(2-hydroxyethyl)-N-(3-lauryloxy-2-hydroxypropyl)-, -N-(3-myristyloxy-2-hydroxypropyl)-, -N-(3-palmityloxy-2-hydroxypropyl)- or -N-(3-stearyloxy-2-hydroxypropyl)-ammonium ethylsulfate
or
N,N-dimethyl-N-(2-hydroxyethyl)-N-(3-lauryloxy-2-hydroxypropyl)-, -N-(3-myristyloxy-2-hydroxypropyl)-, -N-(3-palmityloxy-2-hydroxypropyl)- or -N-(3-stearyloxy-2-hydroxypropyl)-ammonium ethylsulfate.

The quaternary ammonium salts ($b_2$) of the general formula II are used individually or as a mixture of a plurality of the ammonium salts ($b_2$). They are also used as mixtures with the tertiary amines and amides ($b_1$). However, it is particularly advantageous to use the tertiary amines and amides ($b_1$) or the quaternary ammonium salts ($b_2$) separately. It is very particularly advantageous to use mixtures of tertiary amines and amides ($b_1$) or mixtures of quaternary ammonium salts ($b_2$). Such mixtures are known and are commercially available. For example, Georg M. Langer and Co. sell mixtures and solutions of quaternary ammonium salts ($b_2$) of the general formula II under the trade names ®Catafor CA 100, CA 80 (solution in butanol), BCA 100 or BCA 80 (solution in butanol) and tertiary amines and amides ($b_1$) of the general formula I under the trade names ®Catafor 06. These amines and amides ($b_1$) are also available commercially under trade names such as ®Armostat 600 from Akzo or ®Antistatikum Hoechst VP FA 14 from Hoechst.

The novel top layer (B) to be used according to the invention is usually produced during the preparation of the novel recording material and is therefore described in the passage relating to this.

Another essential component of the novel recording material is the photosensitive relief-forming layer (A), in which imagewise exposure to actinic light results in a difference between the solubilities of the exposed and unexposed parts, so that the layer can be developed with organic, aqueous alcoholic or aqueous alkaline liquid media.

The photosensitive relief-forming layer (A) contains from 20 to 98.999, preferably from 30 to 95, in particular from 40 to 90, % by weight, based on its total weight, of one or more polymeric binders ($a_1$).

Binders ($a_1$) which are suitable according to the invention are based on the polymer classes consisting of the polyamides, copolyamides, polyesters, polyurethanes, polyalkadienes, vinylaromatic/alkadiene copolymers and block copolymers, alkadiene/acrylonitrile copolymers, butyl rubbers, acrylate rubbers, polychloroprenes, fluorine rubbers, polysulfide rubbers, silicone rubbers, ethylene/propylene copolymers, the chlorosulfonated polyethylenes, the ethylene/(meth)acrylate, ethylene/vinyl acetate and ethylene/(meth)acrylic acid copolymers and the (meth)acrylic acid/(meth)acrylate copolymers, or are selected from this group for use. These polymers which are suitable binders ($a_1$) are known compounds and are obtained by conventional methods of polymer chemistry.

Particularly advantageous binders ($a_1$) are based on the polymer classes of the polyamides, copolyamides, polyalkadienes, vinylaromatic/alkadiene copolymers and block copolymers, alkadiene/acrylonitrile copolymers and the ethylene/(meth)acrylic acid copolymers, or are selected from this group for use.

Examples of particularly advantageous binders ($a_1$) from the polymer class consisting of the polyamides and copolyamides are linear homopolyamides and copolyamides which are prepared in a known manner from bifunctional carboxylic acids and diamines or from ω-amino acids, lactams or suitable derivatives of these compounds, such as nylon 3, 4, 5, 6, 8, 11, 12, 13, 6.6, 6.10 or 6.13; or a polyamide obtained from metaxylylenediamine and adipic acid or from trimethylhexamethylenediamine or isophoronediamine and adipic acid; or nylon 6/6.6, 6/6.6/6.10 or 6/6.6/6.10/6.12; or a polyamide of ε-caprolactam/adipic acid/hexamethylenediamine/4,4-diaminodicyclohexylmethane or of ε-caprolactam/adipic acid/hexamethylenediamine/polyethyleneglycoldiamine; or the N-methylol or N-alkoxymethyl derivatives of all these homopolyamides and copolyamides; or homopolyamides and copolyamides of the stated type which contain photopolymerizable radicals ($a_3$).

Examples of particularly advantageous binders ($a_1$) from the polymer class consisting of the alkadienes are natural rubber, the homopolymers of butadiene or isoprene, butadiene/isoprene copolymers or the corresponding polymers with photopolymerizable radicals ($a_3$).

Examples of particularly advantageous binders ($a_1$) from the polymer class consisting of the vinylaromatic/alkadiene copolymers are copolymers of styrene and butadiene and/or isoprene having a random distribution of the copolymerized monomers and containing preferably from 10 to 50% by weight of copolymerized styrene, or the corresponding copolymers having photopolymerizable radicals ($a_3$).

Examples of particularly advantageous binders ($a_1$) from the polymer class consisting of the vinylaromatic/alkadiene block copolymers are those which contain one or more elastomeric diene polymer blocks X and one or more thermoplastic vinylaromatic polymer blocks Y, the blocks X and Y generally being chemically bonded to one another via carbon-carbon bonds. In a given block copolymer, bonding of a block X to a block Y may also be effected by a random or alternating copolymer which contains copolymerized conjugated dienes and vinylaromatics; or the bonding of the blocks X and Y is effected by means of a copolymer of conjugated dienes and vinylaromatics, in which the concentration of copolymerized conjugated dienes decreases from block X toward block Y and the concentration of copolymerized vinylaromatics increases.

Moreover, the block copolymers may be bonded via suitable polyvalent atoms or ions and inorganic, organic or organometallic molecular radicals to form even larger block copolymer associations. In this context, bonding is the formation of covalent or ionic bonds between two molecular radicals.

Furthermore, the olefinic and aromatic bonds or only the olefinic bonds in the diene polymer blocks X can be partially or completely hydrogenated. In addition, the blocks X and Y can contain further copolymerized monomers, which need not be conjugated dienes and vinylaromatics, for example acrylonitrile, acrylic acid, maleic anhydride, (meth)acrylamides or (meth)acrylates, and in general the amount of the block copolymer should not exceed 10% by weight. The blocks X can also contain copolymerized vinylaromatics, the amount of which being chosen so that it does not adversely affect the elastomeric properties of the blocks X. The blocks Y can also contain sufficient conjugated dienes as copolymerized units to prevent it from losing its thermoplastic processability. The block copolymers can also contain photopolymerizable radicals ($a_3$).

If a block copolymer contains a plurality of elastomeric blocks X and/or a plurality of thermoplastic blocks Y, the blocks X and Y need not be chemically identical or similar but can differ substantially from one another, provided that they always have the required elastomeric and thermoplastic properties, respectively.

In general, blocks X have a glass transition temperature Tg of less than 20° C., preferably less than 0° C., in particular less than $-15°$ C. These blocks can in general have a mean molecular weight of from $10^3$ to $2.10^5$ In general, they contain from 30 to 100, in particular from 30 to 95, % by weight, based on the particular block X, of copolymerized conjugated dienes.

Blocks Y generally have a glass transition temperature Tg of more than 20° C. They generally have a mean molecular weight of from $1.5 \times 10^3$ to $2 \times 10^6$, preferably from $5 \times 10^3$ to $1.5 \times 10^6$, in particular from $10^4$ to $1.2 \times 10^6$. They generally contain from 30 to 100, in particular from 40 to 90, % by weight, based on the particular block Y, of copolymerized vinylaromatics.

Examples of advantageous conjugated dienes are butadiene, isoprene, pentane-1,3-diene, 2,3-dimethylbutadiene and hexane-2,4-diene, butadiene and/or isoprene being preferred.

Examples of advantageous vinylaromatics are styrene, α-methylstyrene, p-methylstyrene, p-tert-butylstyrene and 1-vinylnaphthalene, styrene being preferred.

Examples of particularly advantageous block copolymers are the thermoplastic elastomeric 3-block copolymers Y-X-X', in which Y is a thermoplastic, nonelastic styrene polymer block, X is an elastomeric butadiene and/or isoprene polymer block and X' is an elastomeric polymer block which differs from X and consists of copolymerized butadiene and/or isoprene and, if required, copolymerized styrene.

Examples of particularly advantageous block copolymers are 4-block copolymers, such as X-Y-X-Y, Y-X-X'-Y, Y-X-Y-X' and X-X'-Y-X.

Examples of particularly advantageous binders ($a_1$) from the polymer class consisting of alkadiene/acrylonitrile copolymers are the nitrile rubbers, such as butadiene/acrylonitrile copolymers having an acrylonitrile content of from 15 to 40% by weight, or nitrile rubbers of the stated type containing photopolymerizable radicals ($a_3$).

Examples of particularly advantageous binders ($a_1$) from the polymer class consisting of the ethylene/(meth)acrylic acid copolymers are those which are obtainable by copolymerization of monomer mixtures which consist of $a_{11}$) ethylene,
$a_{12}$) acrylic acid and/or methacrylic acid and of
$a_{13}$) one or more further monomers from the group consisting of the vinyl esters, vinyl ethers, acrylates, methacrylates, acrylamides and methacrylamides and for whose weight ratios the following conditions apply:

Number of parts by weight of $(a_{11})+(a_{12})+(a_{13})=100$,
30 parts by weight $\leq$ number of parts by weight of ($a_{11}$) $\leq$ 70 parts by weight,
5 parts by weight $\leq$ number of parts by weight of ($a_{12}$) $\leq$ 50 parts by weight and
5 parts by weight $\leq$ number of parts by weight of ($a_{13}$) $\leq$ 40 parts by weight.

They can be prepared, for example, by the LDPE (=low density polyethylene) high pressure polymerization method at from 200 to 400° C. and under a pressure of more than 800 kg/cm² [see, for example, DE-B No. 23 41 462 and U.S. Pat. No. 3 264 272].

Vinyl esters which are suitable comonomers ($a_{13}$) are in particular those of the general formula

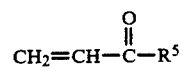
III where $R^5$ is an alkyl or cycloalkyl radical of 1 to 10 carbon atoms, eg. vinyl acetate, vinyl propionate, vinyl butyrate, vinyl valerate or vinyl hexanecarboxylate. Vinyl acetate is preferred.

Vinyl ethers which are suitable comonomers ($a_{13}$) are, in particular, those of the general formula IV

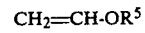
IV where $R^5$ has the abovementioned meanings, eg. vinyl ethyl ether, vinyl prop-1-yl ether, vinyl prop-2-yl ether, vinyl but-1-yl ether, vinyl but-2-yl ether or vinyl pent-1-yl ether. Vinyl but-1-yl ether is preferred.

Acrylates, methacrylates, acrylamides and methacrylamides which are suitable comonomers ($a_{13}$) are, in particular, those of the general formula V

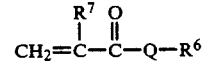
V where $R^7$ is methyl or hydrogen and $R^6$ is an alkyl or cycloalkyl radical of 1 to 10 carbon atoms or an ω-methylpoly(alkylene oxide)-α-oxyl radical and Q is an oxygen atom or an $NR^8$ group where $R^8$ is H or $C_1$-$C_4$-alkyl. Examples of suitable acrylates, methacrylates, acrylamides and methacrylamides are methyl acrylate, methyl methacrylate, ethyl acrylate, ethyl methacrylate, propyl acrylate, propyl methacrylate, n-butyl acrylate, n-butyl methacrylate, n-pentyl acrylate, n-pentyl methacrylate, n-hexyl acrylate, n-hexyl methacrylate, tert-butyl acrylate cyclohexyl acrylate, cyclohexyl methacrylate, 2-ethylhexyl acrylate, 2-ethylhexyl methacrylate, dicyclopentadienyl acrylate, ω-methylpoly-(ethylene oxide)-α-yl (meth)acrylate, ω-methylpoly-(propylene-1,2-oxide)-α-yl (meth)-acrylate, ω-methylpoly-(propylene-1,3-oxide)-α-yl (meth)acrylate, N-methyl-N-butylmethacrylamide and N-ethyl-N-(2-ethylhexyl)-acrylamide. n-Butyl acrylate, 2-ethylhexyl acrylate, ω-methylpoly-(ethylene oxide)-α-yl acrylate and dicyclopentadienyl acrylate are preferred, of which the first three are particularly preferred.

Examples of very particularly preferred copolymers are ethylene/(meth)acrylic acid copolymers which contain n-butyl acrylate, 2-ethylhexyl acrylate and/or ω-methylpoly-(ethylene oxide)-α-yl acrylate as polymerized comonomers ($a_{13}$).

The copolymers may furthermore contain photopolymerizable radicals ($a_3$) of the general formula VI

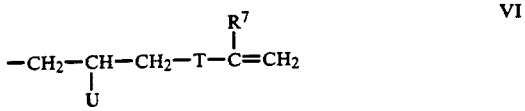

where U is hydroxyl, amino or thiol, T is an ester group, an amine group, an ether group or a $C_1$–$C_{10}$-alkanediyl group and $R^7$ is hydrogen or methyl.

Examples of suitable photopolymerizable radicals ($a_3$) are 2-hydroxy-5-oxo-4-oxahept-6-en-1-yl, 2-amino-5-oxo-4-oxahept-6-en-1-yl, 2-thiolo-5-oxo-4-oxahept-6-en-1-yl, 2-hydroxy-5-oxo-4-oxa-6-methylhept-6-en-1-yl, 2-amino-5-oxo-4-oxa-6-methylhept-6-en-1-yl, 2-hydroxy-5-oxo-4-azahept-6-en-1-yl, 2-amino-5-oxo-4-azahept-6-en-1-yl, 2-thiolo-5-oxo-5-azahept-6-en-1-yl, 2-hydroxy-5-oxo-4-aza-6-methylhept-6-en-1-yl, 2-hydroxy-5,10-dioxo-4,9-dioxa-6-aza-11-methyldodec-11-en-1-yl, 2-amino-5-oxo-4-aza-6-methylhept-6-en-1-yl, 2-thiolo-5-oxo-4-aza-6-methylhept-6-en-1-yl, 2-hydroxy-4-oxahex-5-en-1-yl, 2-amino-4-oxahex-5-en-1-yl, 2-thiolo-4-oxahex-5-en-1-yl, 2-hydroxy-hex-5-en-1-yl, 2-aminohex-5-en-1-yl, 2-thiolohex-5-en-1-yl, 2-hydroxy-hept-6-en-1-yl, 2-aminohept-6-en-1-yl and 2-thiolo-hept-6-en-1-yl. The 2-hydroxy-5-oxo-4-oxa-6-methylhept-6-en-1-yl radical VII is preferred.

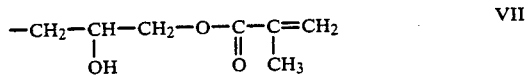

These radicals ($a_3$) may also be present in the other binders ($a_1$).

In addition to the photopolymerizable radicals ($a_3$), or instead of these, the copolymers may also contain side radicals of the general formula VIII

where $R^9$ is a polar group, a hydrogen atom or a further group U.

Polar groups are groups which are capable of a dipole-dipole, dipole-ion or ion-ion interaction.

Examples of suitable radicals of the general formula VIII are 2-hydroxy-eth-1-yl, 2-aminoeth-1-yl, 2-thioloeth-1-yl, 2,3-dihydroxyprop-1-yl, 2-amino-3-hydroxyprop-1-yl, 2-thiolo-3-hydroxyprop-1-yl and 2-hydroxy-2-[ω-alkylpoly-(ethylene oxide)-α-yl]-eth-1-yl.

If the polymeric binders ($a_1$) contain photopolymerizable radicals ($a_3$), their amount is from 1 to 60, preferably from 1.5 to 40, advantageously from 2 to 30, in particular from 2 to 15, % by weight, based on the photosensitive relief-forming layer (A). The addition of monomers ($a_3$) can, if desired, then be dispensed with.

The said layer (A) also contains from 0.001 to 10, preferably from 0.1 to 7, advantageously from 0.2 to 5, in particular from 0.3 to 4, % by weight of one or more photoinitiators ($a_2$), this amount being determined by, inter alia, the amount of components ($a_3$) also used.

Examples of suitable photoinitiators ($a_2$) are benzoin and benzoin derivatives, such as its methyl, isopropyl, n-butyl or isobutyl ether, symmetrically or asymmetrically substituted benzil acetals, such as benzil dimethyl acetal or benzil 1-methyl 1-ethyl acetal; acylarylphosphine oxides, such as 2-dimethoxybenzoyldiphenylphosphine oxide, 2,4,6-trimethylbenzoyldiphenylphosphine oxide, ethyl 2,4,6-trimethylbenzoylphenylphosphinate or sodium 2,4,6-trimethylbenzoylphenylphosphinate, or substituted or unsubstituted quinones, such as ethylanthraquinone, benzanthraquinone, benzophenone or 4,4'-bis-(dimethylamino)-benzophenone. They can be used alone or as a mixture with one another or in combination with coinitiators, for example ethylanthraquinone with 4,4'-bis-(dimethylamino)-benzophenone, benzoin methyl ether with triphenylphosphine, diacylphosphine oxides with tertiary amines or acylarylphosphine oxides with benzil dimethyl acetal.

The photosensitive relief-forming layer (A) furthermore contains from 1 to 60, preferably from 1.5 to 40, advantageously from 2 to 30, in particular from 2 to 15, % by weight of one or more components ($a_3$) compatible with the binder ($a_1$) and containing photopolymerizable olefinically unsaturated groups.

Where these components ($a_3$) are photopolymerizable radicals ($a_3$), reference may be made to the binders ($a_1$).

If, on the other hand, they are monomers ($a_3$), they generally have a boiling point above 100° C. under atmospheric pressure and a molecular weight of up to 3,000, in particular up to 2,000. Examples of suitable monomers are the esters of acrylic acid and/or methacrylic acid with monohydric or polyhydric alcohols, such as butyl acrylate, butyl methacrylate, 2-ethylhexyl acrylate, lauryl (meth)acrylate, ethylene glycol di(meth)acrylate, butane-1,4-diol di(meth)acrylate, neopentylglycol di(meth)acrylate, 3-methylpentanediol di(meth)acrylate, 2-hydroxypropyl (meth)acrylate, 2-hydroxyethyl (meth)acrylate, hexane-1,6-diol di(meth)acrylate, 1,1,1-trimethylolpropane tri(meth)acrylate, di-, tri- and tetraethylene glycol di(meth)acrylate, tripropylene glycol di(meth)acrylate or pentaerythritol tetra(meth)acrylate, poly-(ethylene oxide) di(meth)acrylate, ω-methylpoly-(ethylene oxide)-α-yl (meth)acrylate, N,N-diethylaminoethyl acrylate or a reaction product of 1 mole of glycerol, 1 mole of epichlorohydrin and 3 moles of acrylic acid; the vinyl esters of aliphatic monocarboxylic acids, such as vinyl oleate; the vinyl ethers of alcohols, such as octadecyl vinyl ether and butane-1,4-diol divinyl ether; the diesters of fumaric and maleic acid; or the reaction products of OH-terminated, oligomeric polybutadienes with maleic acid or (meth)acrylic acid, ie. oligomeric polybutadienes having activated, photopolymerizable olefinic double bonds.

The said layer (A) may furthermore contain one or more assistants, with the aid of which the performance characteristics of the relief layer (A') can be varied.

These are, in particular, plasticizers, thermal polymerization inhibitors, dyes, pigments, photochromic additives, agents for improving the relief structure, crosslinking agents, antioxidants, antiozonants, fillers, fluxes or mold release agents. Their amount should not in general exceed 40% by weight, based on the layer (A).

Examples of plasticizers are modified and unmodified natural oils and natural resins, such as paraffinic or naphthenic oils, as well as petroleum resins or pentaerythritol esters of hydrogenated rosin; alkyl, alkenyl, arylalkyl or arylalkenyl alcohol esters of acids, such as citric acid, acetic acid, propionic acid, butyric acid, ethylbutyric acid, ethylhexanoic acid, glycollic acid, benzoic acid, phthalic acid, trimellitic acid, abietic acid, phosphoric acid or stearic acid; synthetic oligomers or resins, such as oligostyrene, oligomeric styrene/butadiene copolymers, oligo-$\alpha$-methylstyrene, oligomeric $\alpha$-methylstyrene/p-methylstyrene copolymers, liquid 1,2- or 1,4-oligobutadienes, oligopentadienes, liquid oligomeric acrylonitrile/butadiene copolymers and polyterpene, polyacrylate, polyester or polyurethane resins, synthetic polymers, such as polyethylene or ethylene/propylene/diene rubbers; $\omega$-methyloligo-(ethylene oxide); or sulfonamides. Amounts of from 1 to 25% by weight, based on the layer (A), are advantageous.

Thermal polymerization inhibitors are generally added in an amount of from 0.001 to 2% by weight, based on the layer (A), and have no significant self-absorption in the actinic range in which the photoinitiator ($a_2$) absorbs. Examples of inhibitors are hydroquinone, p-methoxyphenol, 2,6-di-tert-butyl-p-cresol, $\beta$-naphthol, phenothiazine, pyridine, nitrobenzene, m-dinitrobenzene or chloranil; thiazine dyes, such as thionine blue G (C.I. 52025), methylene blue B (C.I. 52015) or toluidine blue (C.I. 52040); or N-nitrosamines, such as N-nitrosodiphenylamine, or the salts, for example the potassium, calcium or aluminum salts, of N-nitrosocyclohexylhydroxylamine.

Dyes, pigments or photochromic additives can be added to the mixtures in an amount of from 0.0001 to 2% by weight, based on the layer (A). They are used for controlling the exposure properties, for identification, for direct monitoring of the exposure result or for aesthetic purposes. A precondition for the choice and amount of such additives is that, like the thermal polymerization inhibitors, they do not interfere with the photopolymerization of the mixtures. Examples of suitable substances are the soluble phenazinium, phenoxazinium, acridinium and phenothiazinium dyes. These dyes are also used together with a sufficient amount of reducing agent which does not reduce the dye in the absence of actinic light but is capable of reducing the dye in the excited electronic state on exposure. Examples of such mild reducing agents are ascorbic acid, anethole, thiourea, for example diethylallylthiourea, in particular N-allylthiourea, and hydroxylamine derivatives, in particular salts of N-nitrosocyclohexylhydroxylamine, preferably the potassium, calcium and aluminum salts. As mentioned above, the latter can simultaneously serve as thermal polymerization inhibitors.

The reducing agents are generally added in amounts of from 0.005 to 5% by weight, based on the layer (A), and in many cases it has proven useful to add from 3 to 10 times the amount of a concomitantly used dye.

Examples of crosslinking agents are the conventional and known trifunctional and tetrafunctional thiol compounds.

Examples of antioxidants are sterically hindered monophenols, such as 2,6-di-tert-butyl-p-cresol; alkylated thiobis- and alkylidenebisphenols, such as 2,2'-methylenebis-(4-methyl-6-tert-butylphenol) or 2,2'-bis(1-hydroxy-4-methyl-6-tert-butylphenyl) sulfide; hydroxybenzyls, such as 1,3,5-trimethyl-2,4,6-tris-(3,5-di-tert-butyl-4-hydroxybenzyl)-benzene; triazines, such as 2-(4-hydroxy-3,5-tert-butylanilino)-4,6-bis-(n-octylthio)-1,3,5-triazine; polymerized trimethyldihydroquinone; zinc butyldithiocarbamate; dilauryl thiodipropionate; or phosphites, such as tris-(nonylphenyl) phosphite. Amounts of from 0.0001 to 5% by weight, based on the layer (A), are advantageous.

Examples of polymeric or nonpolymeric organic and inorganic fillers or reinforcing fillers which cannot be mixed in to give a molecular disperse system are those which are essentially transparent at the wavelengths of the light used for exposure of the novel mixtures, do not scatter this light and have a refractive index substantially matched to the relevant mixture, for example polystyrene, organophilic silica, bentonite, silica, ®Aerosil, organophilic alumina, glass powder, colloidal carbon and various types of dyes and pigments. These assistants are used in amounts which vary with the desired properties of the novel recording materials. The fillers have the advantage that they improve the strength of the relief-forming layer (A) and of the relief layer (A') prepared therefrom, and their abrasion resistance, and reduce their tack and may act as color-imparting agents.

An example of a flux is calcium stearate.

An example of a mold release agent is talc.

Examples of antiozonants are conventional and known ozone protection waxes and the chloroalkanes (chloroparaffins) having 8 to 40 carbon atoms and from 30 to 73% by weight of chlorine in the molecule.

Examples of agents for improving the relief structure of the printing plates produced from the novel recording materials are 9,9'-dianthronyl and 10,10'-bisanthrone.

Photosensitive relief-forming layers (A) which contain the components ($a_1$), ($a_2$), ($a_3$) and, if required, ($a_4$) described above should be developed with organic, aqueous alcoholic or aqueous alkaline developers after imagewise exposure to actinic light.

The thickness of the layers (A) depends primarily on the intended use of the novel recording materials. For example, the thickness varies in general from 0.001 to 7 mm, preferably from 0.1 to 7 mm, in particular from 0.7 to 6.5 mm, because recording materials which have layers (A) of this thickness are suitable for the majority of printing techniques and for the photoresist technique.

Another essential component of the novel recording material is the cover sheet (C) which can readily be detached from the top layer (B).

The cover sheets (C) are generally from 10 to 250 $\mu$m, in particular from 20 to 150 $\mu$m, thick. They essentially consist of plastics, textile materials, papers or metals. The surface of the cover sheets (C) which rests directly on the top layer (B) is either smooth, ie. has a surface roughness $R_{max}$ of $\leq 0.1$ $\mu$m, or is matt, ie. has a surface roughness $R_{max}$ of from 0.1 to 15 $\mu$m, preferably from 0.3 to 10 $\mu$m, in particular from 0.5 to 7 $\mu$m. If the cover sheet (C) is matt, its pattern of roughness leaves an impression in the top layer (B) and may also do so in the surface of the relief-forming layer (A). This smooth or matt surface of the cover sheet (C) may also be rendered antiadhesive, ie. it may have, for example, a 0.1–0.5 μm thick antiadhesion layer (AL) of conventional and known silicones or of other plastics, such as polyethylene or polypropylene. Cover sheets (C) of textile materials or papers may furthermore be impregnated with plastics, such as urea/formaldehyde or polyolefins. Cover sheets (C) of plastics may furthermore be biaxially oriented. It is frequently advantageous if, before biaxial orientation, a 0.1–0.5 μm thick layer of, for example, a vinylidene chloride copolymer is applied to that side of (C) which subsequently rests directly on (B).

Examples of particularly advantageous cover sheets (C) are 20–150 μm thick, smooth or matt, biaxially oriented or unoriented plastic films which may have been rendered anti-adhesive and consist of polyethylene, polypropylene, polyamide, polystyrene, styrene/acrylonitrile copolymers or polymethyl methacrylate; or of copolymers of methyl methacrylate with methacrylic acid, acrylic acid, methyl acrylate or butyl acrylate; or of polyvinyl chloride, polyvinyl acetate, vinyl chloride/vinyl acetate copolymers, polyvinyl alcohol, polyvinylpyrrolidone, polycarbonate, cellulose esters, such as cellulose acetate succinate, or of polyethylene terephthalate; cover sheets (C) of polyethylene terephthalate are very particularly advantageous.

In addition to these essential components (A), (B) and (C), the novel recording materials may have further layers which are useful for the functioning of the recording materials.

For example, the photosensitive relief-forming layer (A) can be bonded to a dimensionally stable base (BA) either firmly or so that it is readily detachable. The dimensionally stable base (BA) in turn can have a resilient and flexible under-layer (UL). Furthermore, a firm bond can be achieved between (BA) and (A) with the aid of an adhesion-promoting layer (AP).

Suitable dimensionally stable bases (BA) are sheets, foils or conical or cylindrical sleeves of metals, such as steel, aluminum, copper or nickel or of plastics, such as polyethylene terephthalate, polybutylene terephthalate, polyamide or polycarbonate. Fabric and fleece, for example glass fiber fabric or composite materials of, for example, glass fibers and plastics, such as polyethylene terephthalate, are also suitable. Other suitable bases (BA) are boards, as usually employed in the production of printed circuit boards.

Advantageously used adhesion-promoting layers (AP) are conventional and known adhesion-promoting coating layers having a thickness of about 0.5–40 μm.

If the bases (BA) used are highly reflective sheets or foils, they may contain suitable antihalation agents, such as carbon black or manganese dioxide. The antihalation agents can, however, also be applied as a separate layer on (BA) or may be present in the adhesionpromoting layer (AP) or in the relief-forming layer (A).

The production of the essential components (A), (B) and (C) of the novel recording material has no special technical features but is carried out by the conventional and known methods for the production of photosensitive layers and top layers and by the conventional and known methods for the production of foils from plastics, textile materials, papers or metals.

For example, the photosensitive relief-forming layers (A) and the top layers (B) are usually produced by mixing the relevant components by means of the conventional kneaders, mixers and dissolution methods, followed by molding of the mixtures to give sheet-like layers by means of casting from solution, hot pressing, calendering or extrusion. Usually, these operations are integrated in the process for the preparation of the novel recording materials.

The components of the particularly advantageous cover sheets (C) are likewise combined by means of the usual kneading, mixing and dissolution techniques and molded by casting from solution, hot pressing, calendering or extrusion and blow molding to give the relevant films. These operations too can be integrated in the process for the preparation of the novel recording materials; usually, however, the cover sheets (C) are produced separately, wound on rolls and used in this form for the production of the novel recording materials.

The production of the novel recording materials also has no special technical features but is carried out in a conventional manner by bonding the relief-forming layer (A) to the top layer (B) and the cover sheet (C), and this may also be effected on a dimensionally stable base (BA), with or without the use of an adhesionpromoting layer (AP) and of a resilient and flexible underlayer (UL). It is in principle possible first to bond the relief-forming layer (A) to the base (BA) and then to cover the free side of the said layer with the top layer (B) and the cover sheet (C), or first to apply the relief-forming layer (A) to the top layer (B) which, in turn, covers the cover sheet (C) before bonding the said layer (A) to the base (BA). These operations can of course be carried out in conventional and known, continuous or batchwise units, in succession or simultaneously.

The novel recording materials are used for the production of photopolymerized letterpress printing plates, gravure printing plates, flexographic printing plates and relief plates and photoresists. They are particularly suitable for the production of photopolymerized letterpress, gravure and flexographic printing plates.

The production of the photopolymerized printing plates, relief plates and photoresists from the novel recording materials comprises the following operations:

(1) possible pretreatment of the novel recording materials,
(2) peeling off the cover sheet (C) from the top layer (B),
(3) positioning of an image mask or photographic negative on the top layer (B),
(4) imagewise exposure of the photosensitive relief-forming layer (A) to actinic light of wavelength of from 230 to 450 nm, in particular from 350 to 450 nm,
(5) washing out (developing) the unexposed parts of the imagewise exposed relief-forming layer (A) with organic, aqueous alcoholic or aqueous alkaline media (developers), the top layer (B) too being washed away, and
(6) drying and
(7) if necessary, aftertreatment of the photopolymerized printing plates, relief plates and photoresists obtained in this manner, which now contain or consist of a relief layer (A').

Depending on the intended use of the photopolymerized printing plates, relief plates and photoresists, the thickness of the relief layer (A') varies from 0.001 to 7 mm, preferably from 0.1 to 7 mm, in particular from 0.7 to 6.5 mm.

A conventional method of pretreatment is uniform exposure of the relief-forming layer (A) from the back to actinic light. The back is understood here as meaning that side which faces away from the subsequently formed relief.

Suitable sources of actinic light are commercial UV fluorescent tubes, medium pressure, high pressure and low pressure mercury lamps, superactinic fluorescent tubes, pulsed xenon lamps, lamps doped with metal iodides or carbon arc lamps.

Examples of suitable organic developers are aliphatic or aromatic hydrocarbons, such as n-hexane, n-heptane, octane, petroleum ether, naphtha, limonene, or other terpenes, toluene, xylene, ethylbenzene or isopropylbenzene or mixtures of these solvents; ketones, such as acetone or methyl ethyl ketone; ethers, such as di-n-butyl ether; esters, such as ethyl acetate or ethyl acetoacetate; aliphatic halohydrocarbons, such as methylene chloride, chloroform, trichloroethanes, tetrachloroethylene, dichlorotetrafluoroethanes or trichlorotrifluoroethanes; mixtures which contain two or more of these components; mixtures which contain one or more of these solvents and in addition alcohols, such as methanol, ethanol, isopropanol or n-butanol; or solvents and mixtures of the stated type which additionally contain solid, liquid or gaseous organic and inorganic compounds, for example surfactants, in minor amounts.

Examples of suitable aqueous alcoholic developers are aqueous solutions of methanol, ethanol, isopropanol or n-butanol, which may additionally contain solid, liquid or gaseous organic and inorganic compounds, for example surfactants, complex formers, salts, alkali metal hydroxide solutions, ammonia or amines, in minor amounts.

Examples of suitable aqueous alkaline developers are aqueous solutions of lithium hydroxide, sodium hydroxide or potassium hydroxide or of lithium carbonate, sodium carbonate, potassium carbonate, lithium bicarbonate, sodium bicarbonate or potassium bicarbonate or of ammonia, which may additionally contain solid, liquid or gaseous organic and inorganic compounds, for example surfactants, complex formers or salts, in minor amounts.

Conventional methods for aftertreating the relief layer (A') are uniform post-exposure to actinic light of wavelength λ 150–450 nm, post-exposure to visible light or treatment with halogen-containing solutions.

The letterpress, gravure and flexographic printing plates obtained in this manner can be mounted on printing cylinders and used for continuous printing.

The photoresists produced in this manner can be used, for example, for the production of printed circuit boards.

The novel top layer (B) to be used according to the invention has many particular advantages, such a large number of advantages being unexpected in view of its high content of additives:

Apart from the fact that the novel top layer (B) can, as in the past, be produced in a simple manner in precise constant thickness, has a high tensile strength, is transparent to light, hard, non-tacky and impermeable to oxygen and is readily soluble or swellable in the developers, facilitates detachment of the cover sheet (C) and improves contact with the image mask or photographic negative, the amines and amides ($b_1$) and the ammonium salts ($b_2$) present in the said layer do not tend to migrate, so that the said layer has excellent longterm stability,
the said layer prevents electrostatic charging of the novel recording materials and the deposition of dirt particles and improves the copying properties of the novel recording materials, so that it
substantially facilitates, or even permits, the production of high quality photopolymerized letterpress printing plates, gravure printing plates, flexographic printing plates and relief plates which very faithfully reproduce detail and of photoresists.

The recording materials according to the invention which contain the novel top layer (B) likewise have many unexpected advantages. For example, they are simpler to produce in an exactly reproducible manner, do not become electrostatically charged when their cover sheet (C) is peeled off, have excellent copying properties, their wide exposure latitude being noteworthy, and possess excellent resolution, so that very fine image elements, including those in the form of shadows, can be reproduced in a manner which is faithful to detail, and do not tend to suffer loss of detail through polymerization or the feared internal texturing, which means that fine image elements project above neighbouring coarser image elements.

Other particular advantages of the novel recording materials are apparent especially in the photopolymerized letterpress, gravure and flexographic printing plates produced from them. Their relief layer (A') has no polymerization gradients and no undercutting of relief parts due to halation. Even the every fine image elements stand completely satisfactorily next to coarser elements. In this context, the crisp formation of the shadow well depths is particularly noteworthy. In general, the original of the image mask or photographic negative is reproduced in a manner which is completely faithful to detail by the relief layer (A'), so that the relevant printing plates are high quality products which meet very high quality requirements or even surpass these. During printing of continuous stationery, the printing plates have excellent ink-transfer properties and show no tendency to edge fragmentation or to delamination of relief parts as a result of inadequate relief support, so that they have a particularly long life, permitting long print runs with excellent printed products. In this connection, it should be particularly emphasized that it is precisely with photopolymerized gravure printing plates produced from the novel recording materials that scratchfree printing is achieved.

EXAMPLES AND COMPARATIVE EXPERIMENTS

In the Examples and Comparative Experiments which follow, the electric field strength generated with uniform loading of the recording materials, in conjunction with the relaxation time $t_{50}$ during which the electric field strength reaches 50% of the original value, served as a measure of the electrostatic chargeability of the recording materials.

To measure the relaxation time $t_{50}$, the cover sheet (C) of the recording materials was peeled off mechanically from the relevant top layers (B) (Examples 1 to 4 according to the invention) or from the relevant known top layers (Comparative Experiments 1 to 4) under exactly comparable conditions, after which the resulting electric field strength (kV/m) and its decrease with time were measured inductively by a non-contact method using an electrostatometer. The more rapid this decrease, the more advantageous is the relevant recording material.

For imagewise exposure of the photosensitive recording materials, the conventional and known halftone or continuous-tone image masks or photographic negatives and conventional exposure apparatuses were used.

Commercial spray washers were used for development of the exposed recording materials.

The aftertreatment bath used was a 0.4% strength aqueous, surfactant-containing bromine solution.

The recording materials were produced in a conventional and known manner by extruding the components of the relief-forming layers (A) in a twin-screw extruder, extruding the mixtures through a broad slot die and bonding the resulting photosensitive relief-forming layers (A) to dimensionally stable bases (BA) and cover sheets (C), which have top layers (B) or known top layers on the side facing the relief-forming layers (A), by means of calendering. Before further processing, the recording materials were dried in a conventional manner and stored for one week.

Production of the novel and of the known top layers on the cover sheets (C) was effected by casting from solutions.

The production and further processing of the recording materials were carried out in unpurified air.

The quality of the relief layers was assessed visually under a microscope and rated as follows:

Excellent—(Defect-free relief, all image elements are completely satisfactorily reproduced, there is no undercutting of the relief side walls or edge fragmentation and there are no scratches)

Good—(Substantially defect-free relief, there is no undercutting of the relief side walls or edge fragmentation, the very fine image elements stand but are not of optimum quality, a few scratches are present)

Poor—(Relief defective in places, not all of the very fine image elements are faithful to detail but are reproduced with certain distortion, more undercutting of the relief side walls or edge fragmentation is visible, there is a greater number of scratches).

The printing tests were carried out on conventional letterpress, gravure or flexographic printing units, the printing inks conventionally used for the corresponding printing techniques being employed. The achievable print run with excellent printed copies was a measure of the printing quality.

EXAMPLES 1 TO 4 AND COMPARATIVE EXPERIMENTS 1 TO 4

Experimental method:

For the Examples and the Comparative Experiments, four photosensitive mixtures, as typically used for photosensitive relief-forming layers (A) in flexographic printing plates (Examples 1a, 1b, 2a and 2b; Comparative Experiments 1-Va, 1-Vb, 1-Vc, 2-Va, 2-Vb and 2-Vc), letterpress printing plates (Examples 3a and 3b; Comparative Experiments 3-Va, 3-Vb and 3-Vc) and gravure printing plates (Examples 4a and 4b; Comparative Experiments 4-Va, 4-Vb and 4-Vc), were first prepared.

These mixtures were molded to photosensitive relief-forming layers (A) on bases (BA). The bases (BA) used were 125 $\mu$m thick polyethylene terephthalate films which had a 0.5 $\mu$m thick polyurethane adhesion-promoting layer on the side facing the relief-forming layer (A). The thickness of the particular relief-forming layer (A) depended primarily on the intended use and was 3 mm (Examples 1a, 1b, 2a and 2b; Comparative Experiments 1-Va, 1-Vb, 1-Vc, 2-Va, 2-Vb and 2-Vc) in the case of the flexographic printing plates, 0.8 mm (Examples 3a and 3b; Comparative Experiments 3-Va, 3-Vb and 3-Vc) in the case of the letterpress printing plates and 0.2 mm (Examples 4a and 4b; Comparative Experiments 4-Va, 4-Vb and 4-Vc) in the case of the gravure printing plates.

The relief-forming layers (A) were covered with the novel top layers (B) (Examples) or known top layers (Comparative Experiments) and with 125 pm thick polyethylene terephthalate films (C) which were matt on one side ($R_{max}$=5 $\mu$m).

Table 1 gives an overview of the composition of the relief-forming layers (A), of the top layers (B) and of the known top layers.

After the production of these novel and known recording materials, their electrostatic chargeability was determined separately on samples taken from the recording materials.

The results of these measurements are summarized in Table 2.

Furthermore, after the cover sheets (C) had been peeled off, the recording materials were exposed imagewise, developed, dried and, in the case of the photopolymerized flexographic printing plates of Examples 1a and 1b and of Comparative Experiments 1-Va to 1-Vc, aftertreated and dried again, and were clamped on printing cylinders and used for continuous printing.

Printing plates from Examples 1a and b and from Comparative Experiments 1-Va to 1-Vc were developed using organic developers (tetrachloroethylene/n-butanol, volume ratio 4 : 1), those from Example 2a and b and from Comparative Experiments 2-Va to 2-Vc were developed using aqueous alkaline developers (0.5% strength sodium hydroxide solution) and those from the remaining Examples and Comparative Experiments were developed using aqueous alcoholic developers (water/ethanol, volume ratio 18:82).

The results of the visual assessment of the quality of the relief layers (A') and the results of the printing tests are also shown in Table 2.

Comparison of all these test results shows that the novel recording materials have a substantially lower electrostatic chargeability than the known recording materials and that they give better photopolymerized printing plates and longer print runs of excellent printed copies compared with the known recording materials.

In Table 1, the abbreviations used and the short names in inverted commas have the following meanings:

Block copolymer: A block copolymer Y-X-X' (viscosity number VN=164.9 ml/g; mean molecular weight $M_w$=1.9×10$^5$) having the composition: 10% by weight of polystyrene (Y block), 80% by weight of polyisoprene (X block, glass transition temperature Tg=−35° C.) and 10% by weight of polyisoprene containing 53% of 3,4-structures and 40% by weight of copolymerized styrene (X' block, glass transition temperature Tg=+10° C.);

HDA$_2$: 1,6-hexanediol diacrylate;

Initiator I: Benzil dimethyl acetal;

Chloroalkane: Chloroparaffin containing 49% of chlorine and having a density of 1.24 g/cm$^3$;

Oligomer: Oligomer of 70% by weight of p-methylstyrene and 30% by weight of α-methylstyrene;

EPM: EPM rubber of 60% by weight of ethylene and 40% by weight of propylene;

Polymer: Copolymer prepared by copolymerization of a mixture of 56.6% by weight of ethylene, 14.9% by weight of acrylic acid, 11% by weight of ω- methylpoly-(ethylene oxide)-α-yl acrylate and 17.5% by weight of 2-ethylhexyl acrylate and containing 1% by weight of 2-hydroxy-5-oxo-4-oxa-6-methylhept-6-en-1-yl radicals (photopolymerizable radicals a₃);

TEGA₂: Tetraethylene glycol diacrylate;
Initiator II: 2,4,6-trimethylbenzoyldiphenylphosphine oxide;
Calcium salt: Calcium salt of N-nitrosocyclohexylhydroxylamine;
PVA: Commercial polyvinyl alcohol (polyvinyl acetate having a degree of hydrolysis of 95%);
Polyamide I or Commercial polyamide from BASF AG,
$^R$Ultramid-1C;
Polyamide II or Commercial polyamide from Henkel AG,
PA II: $^R$Macromelt;
HDMA₂: 1,6-hexanediol dimethacrylate;
TMPTMA: Trimethylolpropane trimethacrylate;
Potassium salt: Potassium salt of N-nitrosocyclohexylhydroxylamine;
HEMA: 2-hydroxyethyl methacrylate;
SiO₂: Commercial pyrogenic silica, $^R$Aerosil;
Amine ($b_{11}$): N,N-bis-(2-hydroxyethyl)-N-stearylamine;
Amine ($b_{12}$): N,N-bis-(2-hydroxyethyl)-lauramide, N,N-bis-(2-hydroxyethyl)-palmitic acid amide and N,N-bis-(2-hydroxyethyl)-oleamide (weight ratio 1 : 3 : 1.1);
Amine ($b_{13}$): N,N-bis-(2-hydroxyethyl)-N-palmitylamine and N,N-bis-(2-hydroxyethyl)-N-oleylamine (weight ratio 10 : 1);
Ammonium salt ($b_{21}$): N-methyl-N,N-bis-(2-hydroxyethyl)-N-stearylammonium ethylsulfate;
Ammonium salt ($b_{22}$): N,N-dimethyl-N-(2-hydroxyethyl)-N-(3-stearylamidopropyl)-ammonium ethylsulfate;
Ammonium salt ($b_{23}$): N-methyl-N,N-bis-(2-hydroxyethyl)-N-(3-lauryloxy-2-hydroxypropyl)ammonium ethylsulfate, N-methyl-N,N-bis-(2-hydroxyethyl)-N-(3-myristyloxy-2-hydroxypropyl)ammonium ammonium ethylsulfate and N,N,N-trimethyl-N-(2-hydroxyethyl)ammonium ethylsulfate (weight ratio 10:2:0.5).

TABLE 1

Examples 1 to 4 and Comparative Experiments 1V to 4V; composition of novel and known recording materials

| Example No. | Composition of the photosensitive relief-forming layer (A) | Composition of the top layer (B) | | | | |
|---|---|---|---|---|---|---|
| | | a | b | Va | Vb | Vc |
| 1 | 80.917% by wt. of "block copolymer" 7.268% by wt. of HDA₂ 1.350% by wt. of "Initiator I" 5.000% by wt. of "chloroalkane" 5.000% by wt. of "oligomer" 0.457% by wt. of 2,6-di-tert-butyl-p-cresol 0.008% by wt. of Solvent Black 3 (C.I. 26150) | EPM (90% by wt.) "Amine ($b_{11}$)" (10% by wt.) | EPM (97% by wt.) "Ammonium salt ($b_{21}$)" (3% by wt.) | EPM (100% by wt.) | EPM (95% by wt.) Oxyethylated oleyl phosphate (5% by wt.) | EPM (97.99% by wt.) HDA₂ (2% by wt.) "Initiator I" (0.01% by wt.) |
| 2 | 92.123% by wt. of "Polymer" 5.070% by wt. of TEGA₂ 0.506% by wt. of "Initiator II" 0.920% by wt. of 2,6-di-tert-butyl-p-cresol 0.414% by wt. of "Calcium salt" 0.046% by wt. of safranine T (C.I. 50240) 0.921% by wt. of MgO | PVA (95% by wt.) "Amine ($b_{12}$)" (5% by wt.) | PVA (96% by wt.) "Ammonium salt ($b_{22}$)" (4% by wt.) | PVA (100% by wt.) | PVA (90% by wt.) Oxyethylated oleyl phosphate (10% by wt.) | PVA (98% by wt.) Isooctyphenyl-polyethoxy-ethanol with 9 or 10 ethoxy groups (2% by wt.) |
| 3 | 71% by wt. of "Polyamide I" 15% by wt. of HDMA₂ 6% by wt. TMPTMA 2.095% by wt. of "Initiator I" 5% by wt. of N-ethyltoluene-sulfonamide 0.9% by wt. of "Potassium salt" 0.005% by wt. of safrinine T (C.I. 50240) | "PA II" (85% by wt.) "Amine ($b_{13}$)" (15% by wt.) | "PA II" (90% by wt.) "Ammonium salt ($b_{23}$)" (10% by wt.) | "PA II" (100% by wt.) | "PA II" (95% by wt.) Oxyethylated oleyl phosphate (5% by wt.) | "PA II" (96.99% by wt.) HDMA₂ (3% by wt.) "Initiator I" (0.01% by wt.) |
| 4 | 50% by wt. of "Polamide I" 40% by wt. of HEMA 2% by wt. of "Initiator II" 0.9% by wt. of "Potassium salt" 0.05% by wt. of safranine I (C.I. 50240) 7.05% by wt. of "SiO₂" | "PA I" (95% by wt.) "Amine ($b_{11}$)" (5% by wt.) | "PA I" (98% by wt.) "Ammonium salt ($b_{21}$)" (2% by wt.) | "PA I" (100% by wt.) | "PA I" (95% by wt.) Oxyethylated oleyl phosphate (5% by wt.) | "PA I" (96% by wt.) HEMA (3.99% by wt.) "Initiator II" (0.02% by wt.) |

TABLE 2

Electrostatic chargeability of the recording materials from Table 1 and the relevant performance characteristics of the photopolymerized printing plates produced therefrom

| Example No. | Field strength (kV/m) | $t_{50}$ (min) | Quality of the relief layer (A') Rating | Achievable print run with excellent printed copies in continuous printing | Comments |
| --- | --- | --- | --- | --- | --- |
| 1a | 2 | <0.03 | Excellent | $>5 \times 10^4$ | The printing tests were terminated in each case after this number of copies because no loss of quality was observable |
| 1b | 5 | <0.02 | Excellent | $>5 \times 10^4$ | |
| 2a | 2.5 | <0.01 | Excellent | $>5 \times 10^4$ | |
| 2b | 3 | $\leq 0.02$ | Excellent | $>5 \times 10^4$ | |
| 3a | 10 | <0.01 | Excellent | $>6 \times 10^5$ | |
| 3b | 7 | <0.02 | Excellent | $>6 \times 10^5$ | |
| 4a | 14 | <0.04 | Excellent | $>10^6$ | |
| 4b | 11 | <0.02 | Excellent | $>10^6$ | |
| Comparative Experiments | | | | | |
| 1-Va | 20 | 0.1 | Good | from $3 \times 10^3$ | Gradual loss of quality |
| 1-Vb | 12 | 0.2 | Good | from $2.5 \times 10^3$ | Gradual loss of quality |
| 1-Vc | 25 | 0.1 | Poor | Excellent printed copies not obtainable | |
| 2-Va | 8 | 2 | Good | from $10^4$ | Gradual loss of quality |
| 2-Vb | 5 | 0.4 | Good | from $10^4$ | Rapid loss of quality |
| 2-Vc | 7 | 0.8 | Good | from $2 \times 10^4$ | Gradual loss of quality |
| 3-Va | 20 | 15 | Good | from $3 \times 10^5$ | Gradual loss of quality |
| 3-Vb | 11 | 10 | Poor | Excellent printed copies not obtainable | |
| 3-Vc | 22 | 25 | Poor | Excellent printed copies not obtainable | |
| 4-Va | 11 | 5 | Good | from $4 \times 10^5$ | Gradual loss of quality |
| 4-Vb | 10 | 3.5 | Good | from $3 \times 10^5$ | Gradual loss of quality |
| 4-Vc | 21 | 25 | Poor | Excellent printed copies not obtainable | |

We claim:

1. In a process for preparing a photopolymerized printing plate, relief plate or photoresist from a photosensitive recording element comprising the following layers one on top of the other in the following order:

A) a photopolymerizable relief-forming layer in the imagewise exposure to actinic light results in a difference in solubilities between the exposed and unexposed parts, so that the layer can be developed with organic, aqueous alcoholic or aqueous alkaline liquid media, the photopolymerizable relief-forming layer (A) consisting essentially of, based on its total amount, a₁) from 20 to 98.999% by weight of one or more polymeric binders, a₂) from 0.001 to 10% by weight of one or more photoinitiators, a₃) from 1 to 60% by weight of one or more components which are compatible with the binder (a₁) and contain photopolymerizable olefinically unsaturated groups and a₄) from 0 to 40% by weight of one or more assistants, B) a non-tacky layer which is transparent to light and soluble or swellable in the relevant liquid media, being formed from a polymer forming films of high tensile strength, the top layer (B) adhering more firmly to the layer (A) than to the cover sheet (C) and C) a cover sheet which can be readily peeled off from the top layer (B);

by (1) peeling off the cover sheet (C) from the top layer (B), (2) positioning an image mask or photographic negative on the top layer (B), (3) imagewise exposing the photopolymerizable relief-forming layer (A) to actinic light of a wavelength λ of from 230 to 450 nm through the image mask or photographic negative, and (4) washing out (developing) the unexposed parts of the imagewise exposed relief-forming layer (A) with organic, aqueous alcoholic or aqueous alkaline media, the top layer (B) also being washed away, the improvement comprising preventing the formation of an electrostatic charge on the photosensitive recording element during process step (1) by incorporating into the element a top layer (B) containing, based on its total amount, from 1 to 20% by weight of one or more compounds from the group consisting of b₁) tertiary amines and amides of the formula I

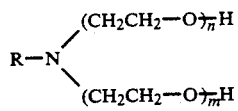

where R is $C_{12}$–$C_{18}$-alkyl, $C_{18}$-alkenyl, $C_{12}$–$C_{18}$-alkanecarbonyl or $C_{18}$-alkenecarbonyl, n is an integer from 1 to 15 and, independently of this, m is an integer from 1 to 15, b₂) quaternary ammonium salts of the formula II

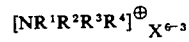

where $X^-$ is $Cl^-$, $Br^-$, $I^-$, $R^1$—O—$PO_3H^-$, $(R^1\text{-}O)_2PO_2^-$, $R^1PO_3^-$, $R^1OSO_3^-$, $R^1$—$COO^-$, $CF_3SO_3^-$ or $R^1$—$OSO_3^-$, $R^1$ is $C_1$-$C_4$-alkyl, $R^2$ and $R^3$ are each $C_1$-$C_{20}$-alkyl or —($-CH_2CH_2-O-$)$_n$-H, where n is an integer from 1 to 15 and $R^2$ and $R^3$ can be identical or different, $R^4$ is —($CH_2CH_2$—O—)$_n$—H, where n is an from 1 to 15, $C_{12}$-, $C_{14}$-, $C_{16}$- and $C_{18}$-alkyl, 3-azatridecan-1-yl to 3-azadocosan-1-yl, 4-azatridecan-1-yl to 4-azadocosan-1-yl, 3-aza-4-oxotridecan-1-yl to 3-aza-4-oxodocosan-1-yl, 4-aza-5-oxotridecan-1-yl to 4-aza-5oxodocosan-1-yl, 3-oxatridecan-1-yl to 3-oxadocosan-1-yl, 4-oxatridecan-1-yl to 4-oxadocosan-1-yl or 2-hydroxy-4-oxatridecan-1-yl to 2-hydroxy-4-oxadocosan-1-yl.

2. The improved process of claim 1, wherein the top layer (B) is formed from polymers which give films of high tensile strength and are selected from the group consisting of the polyamides, copolyamides, polyurethanes, poly(meth)acrylates, polyvinyl alcohol alkanecarboxylates having a high degree of hydrolysis of from 30 to 99%, the cyclized rubbers having a high degree of cyclization, the ethylene/propylene copolymers, the homopolymers and copolymers of vinyl chloride and the ethylene/vinyl acetate copolymers.

3. The improved process of claim 1, wherein the tertiary amines and amides ($b_1$) of the formula I are selected from the group consisting of N,N-bis-(2-hydroxyethyl)-N-lauryl-, -N-tridecyl-N-myristyl-, -N-pentadecyl-, -N-palmityl-, -N-heptadecyl-, -N-stearyl- and -N-oleylamine and of N,N-bis-(2-hydroxyethyl)-lauramide, -pentadecanecarboxylic acid amide, -palmitic acid amide, -heptadecanecarboxylic acid amine, -stearmide and -oleamide.

4. The improved process of claim 1, wherein the quaternary ammonium salts ($b_2$) are selected from the group consisting of the ammonium salts of the formula II, where X is methylsulfate or ethylsulfate, $R^1$ is methyl or ethyl, $R^2$ and $R^3$ are each methyl, ethyl, lauryl, myristyl, palmityl, stearyl or 2-hydroxyethyl, $R^4$ is 2-hydroxyethyl, lauryl, myristyl, palmityl, stearyl or 2-laurylamino-, 2-myristylamino-, 2-palmitylamino- or 2-stearylaminoethyl, 3-laurylamino-, 3-myristylamino-, 3-palmitylamino-or 3-stearylaminopropyl, 2-laurylamido-, 2-myristylamido, 2-palmitylamido- or 2-stearylamidoethyl, 3-stearylamidopropyl, 2-lauryloxy-, 2-myristyloxy-, 2-palmityloxy- or 2-stearyloxyethyl, 3-lauryloxy-, 3-myristyloxy-, 3-palmityloxy-or 3-stearyloxypropyl, or 3-lauryloxy-, 3-myristyloxy-, 3-palmityloxy-or 3-stearyloxy-2-hydroxypropyl.

5. The improved process of claim 1, wherein the photopolymerizable, relief-forming layer (A) contains, as binder ($a_1$), one or more polyamides, copolyamides, polyalkadienes, vinylaromatic/alkadiene copolymers, alkadiene/acrylonitrile copolymers or ethylene/(meth)acrylic acid copolymers.

6. The improved process of claim 1, wherein the photopolymerizable, relief-forming layer (A) contains the components ($a_3$), containing photopolymerizable olefinically unsaturated groups, in the form of radicals which are bonded to the binder ($a_1$) as side groups or terminal groups.

7. The improved process of claim 1, wherein the photopolymerizable, relief-forming layer (A) contains the components ($a_3$), containing photopolymerizable olefinically unsaturated groups, in the form of separate compounds (monomers).

8. The improved process of claim 1, wherein the photopolymerizable, relief-forming layer (A) contains, as binder ($a_1$), one or more vinylaromatic/alkadiene block copolymers.

* * * * *

UNITED STATES PATENT AND TRADEMARK OFFICE
CERTIFICATE OF CORRECTION

PATENT NO. : 5,035,981

DATED : July 30, 1991

INVENTOR(S) : KURTZ et al.

It is certified that error appears in the above-identified patent and that said Letters Patent is hereby corrected as shown below:

Claim 1, Col. 26, Line 55:

"from 1 to 15," should read --from 1 to 15, and--

Line 59:

"$X^{6-3}$" should read --$X^-$--

Line 62:

"$R^1 OSO_3-$" should read --$R^1-SO_3-$--.

Line 68:

"is an from 1 to 15" should read --is an integer from 1 to 15--

Signed and Sealed this

Ninth Day of March, 1993

Attest:

STEPHEN G. KUNIN

Attesting Officer

Acting Commissioner of Patents and Trademarks